(12) United States Patent
Teeter et al.

(10) Patent No.: US 9,801,308 B2
(45) Date of Patent: Oct. 24, 2017

(54) MANAGING CABLE CONNECTIONS AND AIR FLOW IN A DATA CENTER

(71) Applicant: DELL PRODUCTS L.P., Round Rock, TX (US)

(72) Inventors: Victor B Teeter, Round Rock, TX (US); Bruce Anthony Holmes, Austin, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 0 days.

(21) Appl. No.: 15/065,622

(22) Filed: Mar. 9, 2016

(65) Prior Publication Data
US 2017/0265333 A1 Sep. 14, 2017

(51) Int. Cl.
| | |
|---|---|
| *H05K 7/20* | (2006.01) |
| *H01L 23/473* | (2006.01) |
| *H05K 7/00* | (2006.01) |
| *G06F 1/18* | (2006.01) |
| *F28F 13/16* | (2006.01) |
| *H02B 1/06* | (2006.01) |
| *H05K 5/00* | (2006.01) |

(52) U.S. Cl.
CPC .......... *H05K 7/20709* (2013.01); *F28F 13/16* (2013.01); *G06F 1/181* (2013.01); *H02B 1/06* (2013.01); *H05K 5/00* (2013.01); *H05K 7/00* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467; H02B 1/06–1/14; F28F 13/06–13/125
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,142,590 | A  * | 11/2000 | Harwell ............... | H05K 7/1494 312/208.1 |
| 2007/0258212 | A1 * | 11/2007 | Malone ................ | H05K 7/1421 361/699 |
| 2008/0062644 | A1 * | 3/2008 | Petroski .................. | F04D 33/00 361/695 |

(Continued)

Primary Examiner — Anthony Haughton
Assistant Examiner — Razmeen Gafur
(74) Attorney, Agent, or Firm — North Weber & Baugh LLP

(57) ABSTRACT

The electronic device includes a housing that surrounds one or more components of the device and has front, back, top and bottom sides. At least one port is located on at least one of the front and back sides of the housing and configured to receive an end plug of a network cable and communicatively coupled to the one or more components. The housing includes at least one opening formed on at least one of the front and back sides, where the opening is configured to allow the network cable to pass therethrough. At least one side of the housing defines a space so as to allow the network cable to travel between the front side to the back side through the opening and the space.

10 Claims, 7 Drawing Sheets

(56) References Cited

U.S. PATENT DOCUMENTS

| | | | |
|---|---|---|---|
| 2008/0247132 A1* | 10/2008 | Kosacek | H02G 3/30 361/679.4 |
| 2009/0109619 A1* | 4/2009 | Wise | H05K 7/20836 361/695 |
| 2010/0073872 A1* | 3/2010 | Pakravan | H05K 7/20572 361/695 |
| 2012/0127656 A1* | 5/2012 | Driggers | G06F 1/183 361/679.47 |
| 2012/0134104 A1* | 5/2012 | Driggers | G06F 1/183 361/679.46 |
| 2012/0195004 A1* | 8/2012 | Miller | C08J 9/0066 361/705 |
| 2012/0293951 A1* | 11/2012 | Jai | H05K 7/20727 361/679.53 |
| 2013/0188309 A1* | 7/2013 | Ross | H05K 7/20727 361/679.48 |
| 2013/0201618 A1* | 8/2013 | Czamara | H05K 7/1497 361/679.5 |
| 2013/0229768 A1* | 9/2013 | Doll | H05K 7/20736 361/679.46 |
| 2013/0308266 A1* | 11/2013 | Sullivan | G06F 1/20 361/679.46 |
| 2014/0002988 A1* | 1/2014 | Roesner | G06F 1/20 361/679.49 |
| 2014/0016266 A1* | 1/2014 | Lenart | H05K 7/20145 361/690 |
| 2014/0043758 A1* | 2/2014 | Arflack | H05K 7/1489 361/690 |
| 2014/0268549 A1* | 9/2014 | Neumann | H05K 7/20772 361/679.47 |
| 2014/0301037 A1* | 10/2014 | Best | H05K 7/20781 361/679.53 |
| 2014/0313669 A1* | 10/2014 | Babish | H01L 23/473 361/699 |
| 2014/0355185 A1* | 12/2014 | Ehlen | H05K 1/14 361/679.5 |
| 2014/0355201 A1* | 12/2014 | Alshinnawi | H05K 7/20736 361/679.47 |
| 2014/0376174 A1* | 12/2014 | Dean | G06F 1/186 361/679.46 |
| 2015/0016059 A1* | 1/2015 | Esmaily | H05K 7/20145 361/695 |
| 2015/0036293 A1* | 2/2015 | Martini | F24F 11/0001 361/695 |
| 2015/0181747 A1* | 6/2015 | Bailey | H05K 7/20736 361/679.48 |
| 2015/0216069 A1* | 7/2015 | Hori | H05K 7/20727 361/679.48 |
| 2015/0261266 A1* | 9/2015 | Dean | G06F 1/20 361/679.46 |
| 2015/0305202 A1* | 10/2015 | Veino | H05K 7/20709 361/679.46 |
| 2015/0334873 A1* | 11/2015 | Maeda | H05K 7/20736 361/690 |

* cited by examiner

MANAGING CABLE CONNECTIONS AND AIR FLOW IN A DATA CENTER

TECHNICAL FIELD

The present invention relates to managing cable connections and air flow in a data center, and more particularly, to electronic devices having mechanisms for managing cable connections and air flow in a flexible manner.

DESCRIPTION OF THE RELATED ART

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

There often arises a need to control the direction of the air flow across components of air-cooled electronics, such as information handling systems. It is quite common when an air-cooled device is installed in an equipment rack (or, shortly, rack) with other air-cooled electronics in a computer room or data center. FIG. 1 shows a schematic diagram 100 of conventional racks in an air-conditioned computer room. As depicted, two rows of racks, 104 and 106 are located on a floor 102, where each rack (e.g., 106a) may accommodate multiple electronic devices (or, equivalently, equipment) (e.g., network switches 106a1-106a5). An air conditioning (AC) unit (not shown in FIG. 1) may send cold air through the duct 112 under the floor 102. Then, as indicated by arrows 108, the cold air exits the duct 112 through the vents 103 on the floor. The typical method of racking the equipment is to pull in cooler air from the aisle 150 and discharge warmer air to the adjacent aisle 152 (or 154), as indicated by the arrows 110 (or 111).

When arranging the racks and electronic devices in a computer room, a network engineer needs to consider both cabling and cooling of the electronic devices since the cabling may affect the cooling efficiency. FIG. 2 shows an enlarge view of the network switches 106a1-106a4, where each of the switches has multiple ports 134 for receiving network cable plugs/jacks of the cables 140-146. As depicted, the network switches 106a1-106a4 have slots/holes 133 that are aligned to the holes 137 in the rack 106a and receive suitable fasteners 135, such as bolts, so that the network switches are installed in the rack 106a. When the network switches are installed in the rack 106a (or, a data center), the direction of the ports 134 and cables 140-146 typically face both front and back of the rack. It is quite common for a single rack to have over a hundred cables coming out of one or both sides (the majority of them from network switches) of the rack 106a, making cable management a substantial issue.

Typically, the network technician or administrator install/arrange the racks in a direction that will allow for most efficient cooling, that is, to pull cold air from the cold aisle 150 and push the hot (used) air to the hot aisle (152, 154) to be returned to the AC system for cooling. In properly choosing efficient airflow over cable management, it often leaves dozens of cables coming out of both the front and back of the rack 106a.

While cooling is more efficient this way, cabling becomes a larger issue. As depicted in FIG. 2, longer cables are typically required in order to be routed over the rack (cables 140), around the rack (cables 142 and 144), and under the rack (cables 146) to reach various hosts and other equipment. Not only are there increased costs involved for longer cables, but also the usual long cable issues arise like having cables lying along the floor that create a walking hazard, and aesthetics when trying to keep a neat appearance.

Unnecessarily long cables also block views of equipment and ports, making it more difficult to find equipment, ports, and other cables. A simple yet prime example of poor cabling design can be seen by mounting an entire row of two types (first and second types) of switches on a rack, where more than 90% of cables connected to these switches are networking cables and more than 95% of the networking cables are on the back of the first type of switch but on the front of the second type of switch. Unfortunately, the air flows from front to rear on both the first and second types of switches. In such a case, the network engineer may decide whether he wants (1) efficient cabling (not running cables from front to back of the rack, over the top of the rack, around corners, or through the rack, which wastes valuable racking spaces and costs more for cooling) or (2) efficient air flow (not cycling warm air through many systems, causing high AC cost and higher likelihood of thermal issues on the equipment.)

Typically, the interstitial space between two neighboring network switches is not large enough to accommodate the network cables therein. Thus, to reduce the lengths of the cables 140-146, the engineer may leave openings between the network switches (i.e., increase the interstitial space between the network switches) and passes cables 140-146 through the openings. However, this approach wastes rack space and creates insufficient air flow between front and back of the rack 106a (i.e., the cold aisle 150 and the hot aisle (152, 154). As such, there is a need for an approach for efficient cabling without compromising air flow efficiency.

BRIEF DESCRIPTION OF THE DRAWINGS

References will be made to embodiments of the present disclosure, examples of which may be illustrated in the accompanying figures. These figures are intended to be illustrative, not limiting. Although the disclosure is generally described in the context of these embodiments, it should be understood that it is not intended to limit the scope of the disclosure to these particular embodiments. Items in the figures may not be to scale.

DETAILED DESCRIPTION OF THE PREFERRED EMBODIMENTS

Figure 1:
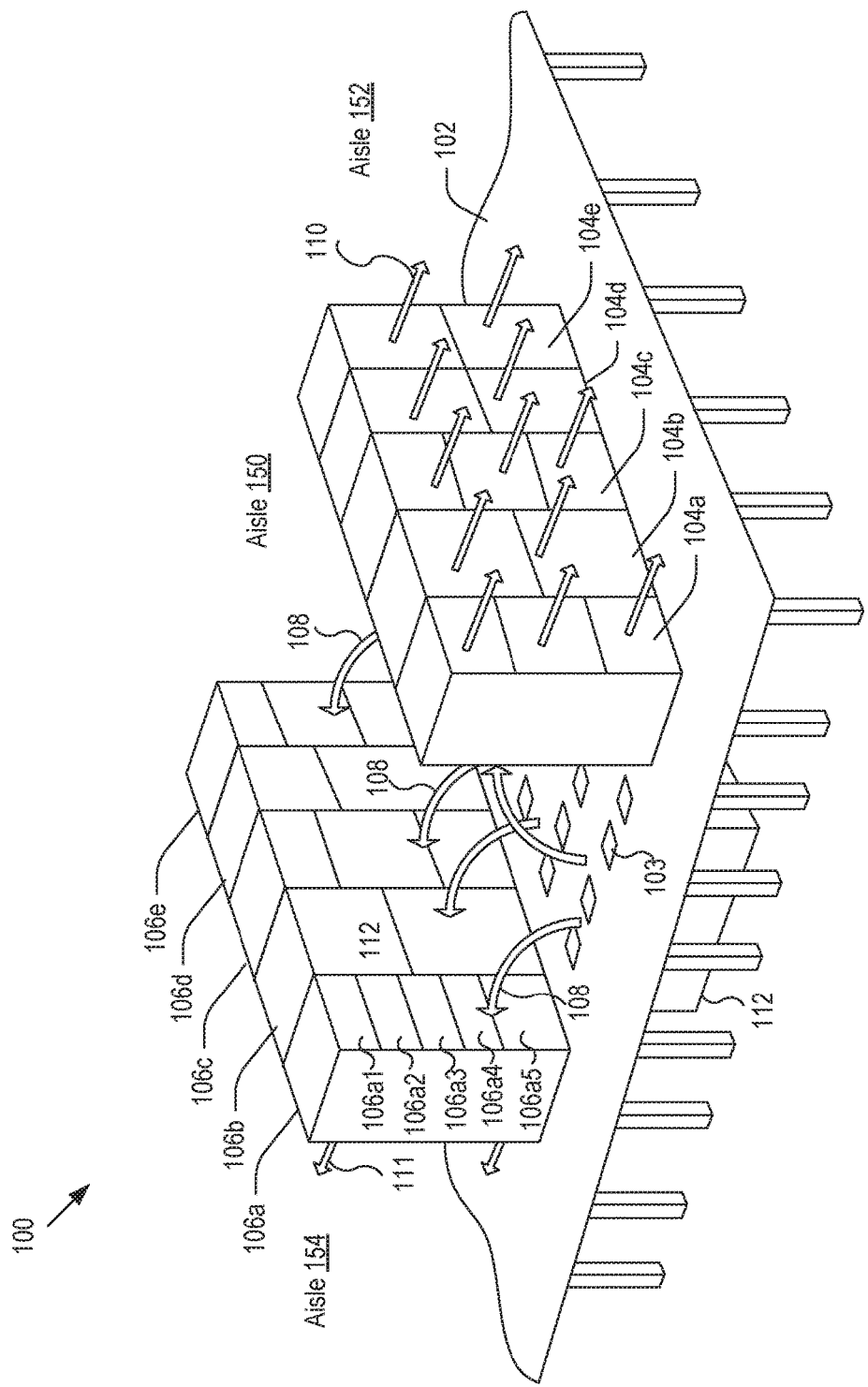
FIG. 1 shows a conventional arrangement of racks in an air-conditioned computer room.
Figure 2:
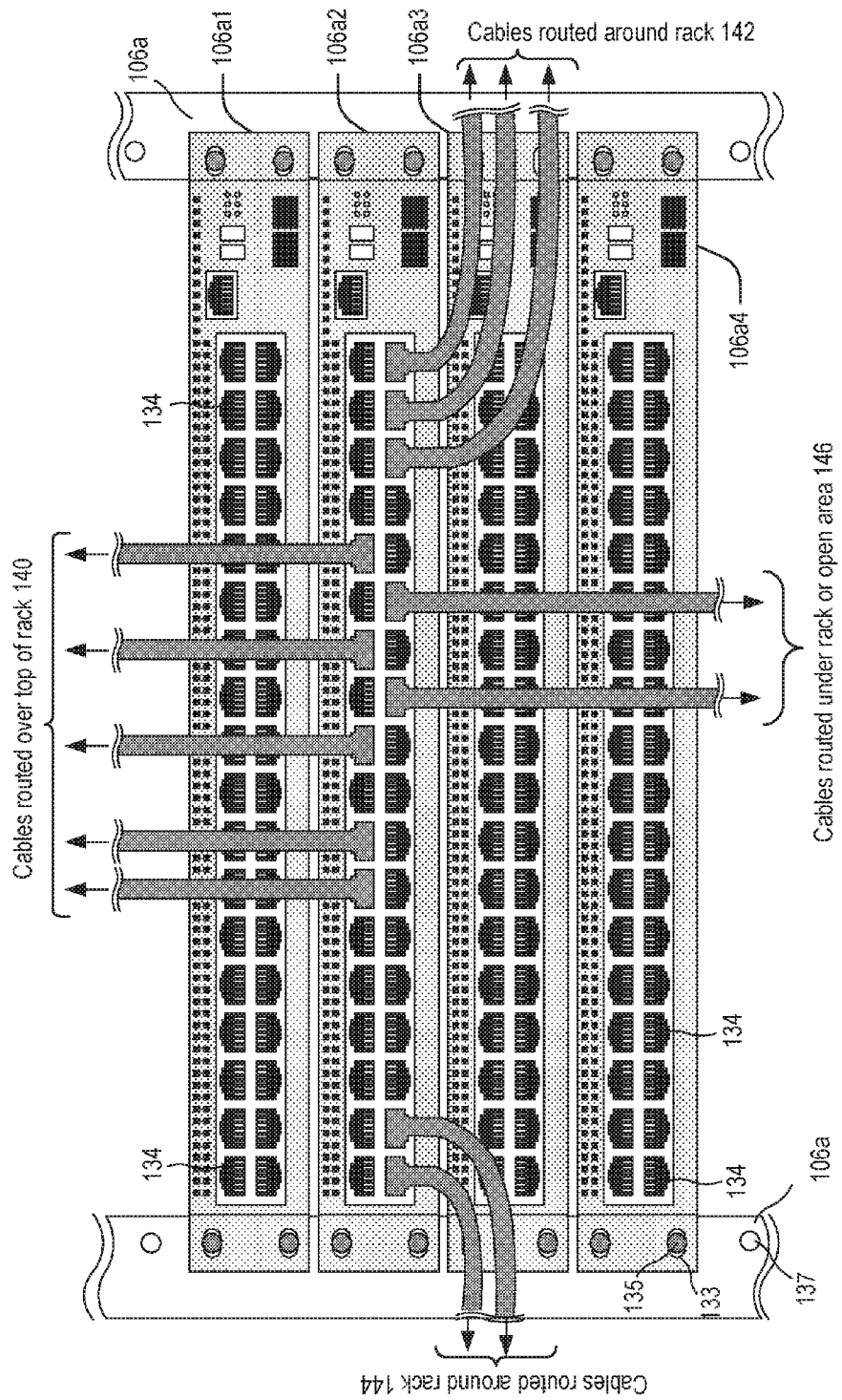
FIG. 2 shows conventional network switches that each have multiple ports for network cables.

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

Elements/components shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components/elements. Components/elements may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled" "connected" or "communicatively coupled" shall be understood to include direct connections, indirect connections through one or more intermediary devices, and wireless connections.

Furthermore, one skilled in the art shall recognize that: (1) certain steps may optionally be performed; (2) steps may not be limited to the specific order set forth herein; and (3) certain steps may be performed in different orders; and (4) certain steps may be done concurrently.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims.

Furthermore, the use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

Figure 3:
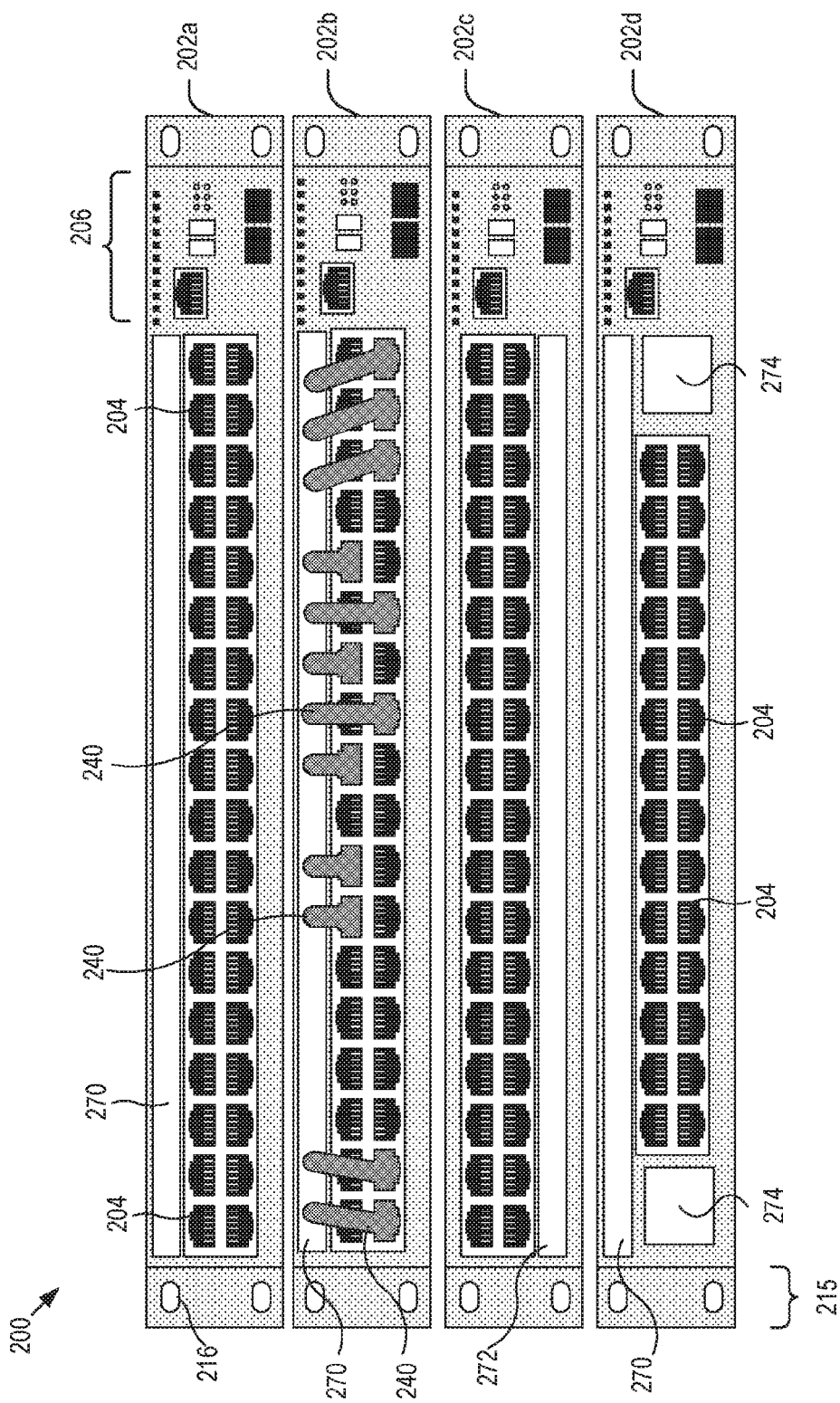
FIG. 3 shows network switches according to embodiments of the present disclosure.

FIG. 3 shows network switches 202a-202d according to embodiments of the present disclosure. In embodiments, the network switches 202a-202d may be installed in a rack (e.g., 106a) by use of the holes 216 on their front panels. In embodiment, the holes 216 may be formed in a rack mounting portion 215 of the housing of each network switch. Each switch manages the flow of data across a network by transmitting a received message to the one or more devices for which the message was intended. For the purpose of illustration, FIG. 3 shows only network switches 202a-202d mounted on a rack. However, it should be apparent to those of ordinary skill in the art that each of the network switches 202a-202d may be replaced by any other suitable type of information handling system that can be mounted on the rack.

In embodiments, each of the network switches 202a-202d may have multiple ports 204 for receiving plugs of network cables 240 to enable communication between different networked devices. Each of the network switches may have a control panel 206 that allows the network engineer to control the switch. It is noted that each of the network switches may have different heights, such as 1-rack unit (RU), 2-RU, or multiple RUs.

In embodiments, each of the network switches 202a-202d has one or more notches (or, openings or slots) through which the cables 240 can pass from front to rear or from rear to front of the switches without sacrificing the rack space. For instance, each of the switches 202a and 202b have a notch 270 in the top side, while the switch 202c has a notch 272 in the bottom side. In another example, the switch 202d has three notches 272 and 274 in the top and sides. It should be apparent to those of ordinary skill in the art that each of the switches may have one or more of the notches 270-274 and that the notches 270-274 may have various shapes, sizes and locations.

Figure 4A:
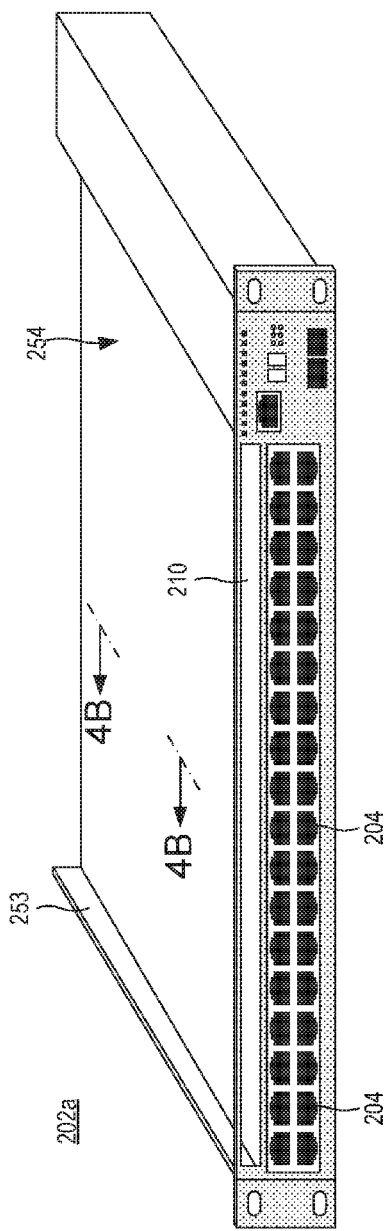
FIG. 4A shows a perspective view of a network switch in FIG. 3.
Figure 4B:
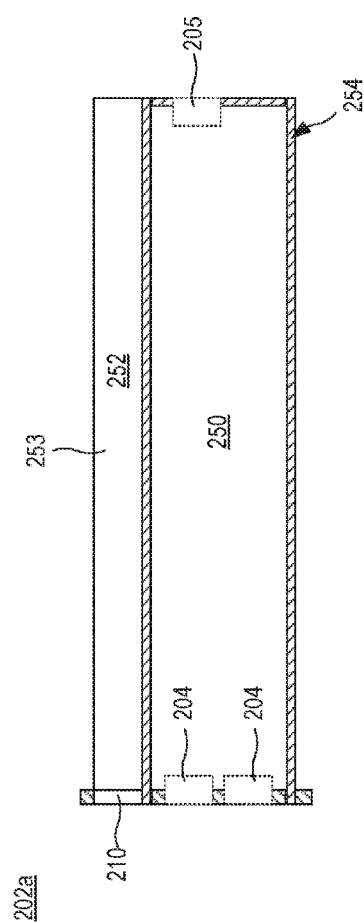
FIG. 4B shows a cross sectional view of the network switch in FIG. 4A, taken along the direction 4B-4B.

FIG. 4A shows a perspective view of the network switch 202a in FIG. 3. FIG. 4B shows a cross sectional view of the network switch 202a in FIG. 4A, taken along the direction 4B-4B. As depicted, the housing 254 may surround the space 250 in which various electronic components are located, where the electronic components are communicatively coupled to the ports 204 and perform the main function of the network switch 202a, such as routing data from one port to another port. Stated differently, the housing 254 includes a plurality of surfaces that form an interior compartment for receiving and at least partially enclosing the electronic components of the network switch 202a. In embodiments, the network switch 202a may have one or more ports 205 on its rear side.

In embodiments, the cable routing volumetric space 252, which is defined by the top surface of the housing 254 and the side wall 253, provides a channel through which the cables can pass. In embodiments, the network switch 202a may not have the side wall 253 that extends above the top surface of the housing. The interior compartment defined by the housing 254 and the cable routing volumetric space 252 define a combined dimensional space that is a standardized rack unit (RU) size when installed on a rack.

Figure 5:
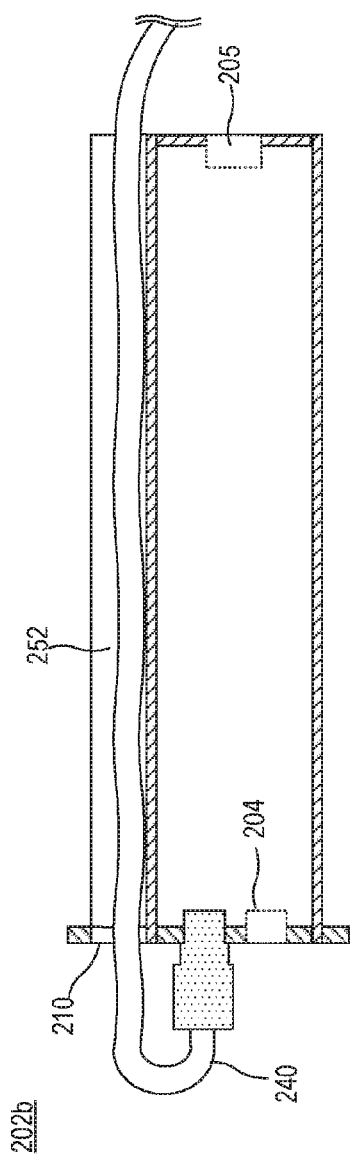
FIG. 5 shows a cross sectional view of a network switch in FIG. 3, where a network cable is connected to the network switch according to embodiments of the present disclosure.

FIG. 5 shows a cross sectional view of the network switch 202b in FIG. 3, where the plug of the network cable 240 is inserted into the port 204 according to embodiments of the present disclosure. As depicted in FIG. 5, the cable 240 may pass through the notch 210 and the interstitial space 252. Unlike in the conventional network switch 106a2 where the cables 140-146 are routed over, around or under rack, the notch 270 (or 272 and 274) allows the cable 240 to pass from front to rear of the network switch 202b through the network device. The notch 270 (or 272 or 274) gives advantage of not having to have multiple Stock keeping Units/parts for front to back and back to front air flow by allowing the network switch to be reversed in the rack and cables to be connected through the rack without using up a space in the rack.

The longer cables that are used in the conventional network switches 106a1-106a4 to go around the rack are very costly and can be hazardous when the cables 140-146 are in walking space on the floor, display a poor appearance and block the view of the switches. The notches 270-274 may relieve/eliminate these problems that the longer cables in the conventional systems may cause.

It is noted that the network devices in FIGS. 4A-5 have ports 204 and 205 on both the front and back sides. However, it should be apparent to those of ordinary skill in the art that ports may be formed on only one of the front and back sides. It is also noted that network switch 202c has a notch 272 formed on the bottom surface of the housing. In such a case, the interstitial space that is similar to the interstitial space 252 may be formed on the bottom side of the housing so that the network cable passes through the interstitial space and the notch 272.

In embodiments, the network switches 202a-202d may be placed between a cold aisle (such as 150) and a hot aisle (such as 152 or 154), where the cold air pulled from the cold aisle may flow through the network switches to extract the heat energy generated by the network switches and the warm/heated air may be discharged to the hot aisle. In embodiments, one or more of the network switches 202a-202d may have mechanisms, such as fans, to generate the air flow. In such embodiments, the notches 270-274 themselves may be like open doors and allow any air to pass through. In order to keep the cold air in the cold aisle (until ready to use) and the hot (used) air in the hot aisle (and not escaping back to the cold aisle), it is recommended that there be a sort of barrier in the notches 270-274. This is regardless of whether fans from each device, or surrounding pressure is used.

Figure 6:
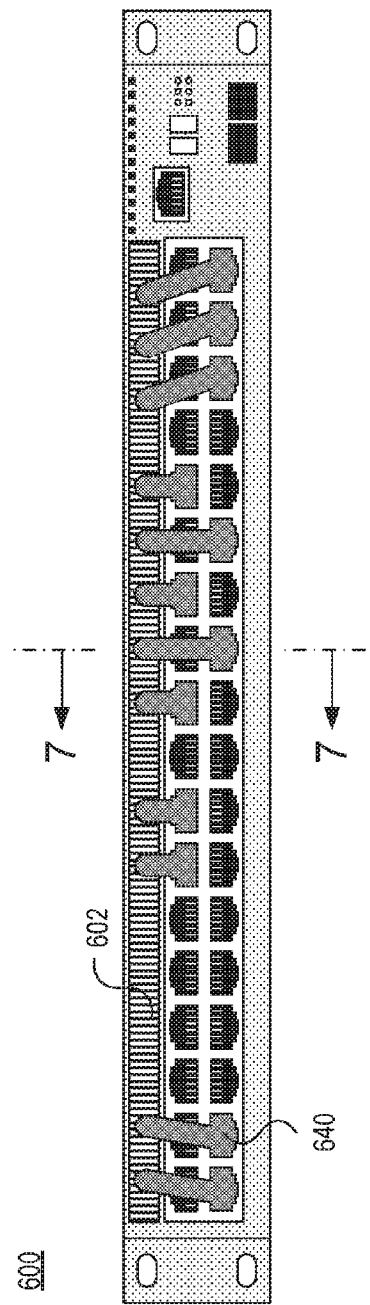
FIG. 6 shows a network switch according to embodiments of the present disclosure.
Figure 7:
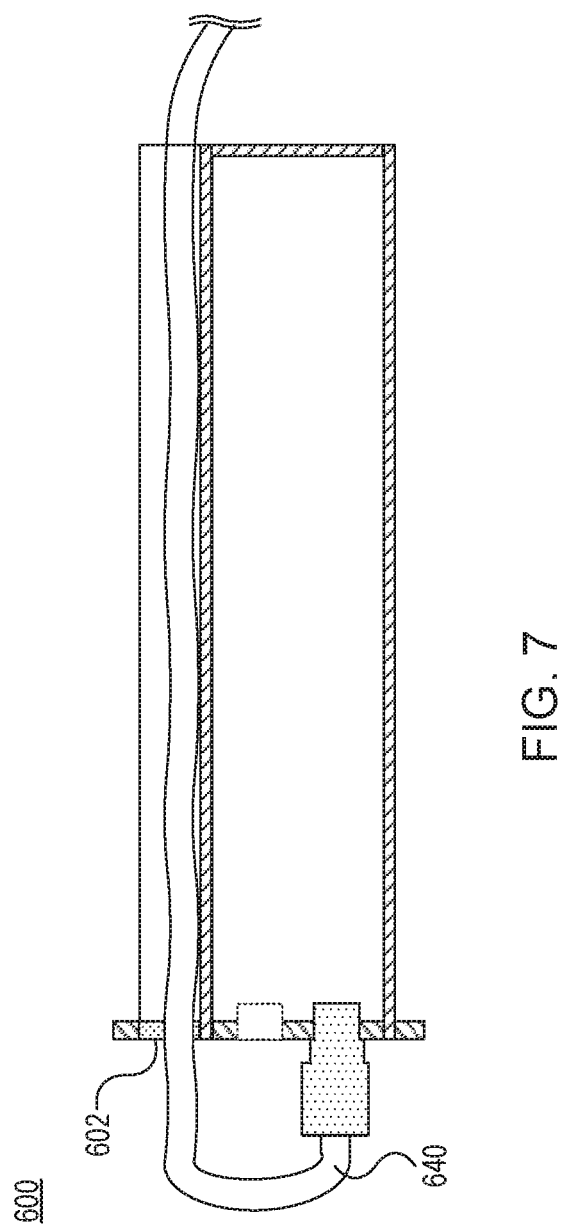
FIG. 7 shows a cross sectional view of the network switch in FIG. 6, taken along the direction 7-7.

FIG. 6 shows a network switch 600 according to embodiments of the present disclosure. FIG. 7 shows a cross sectional view of the network switch 600 in FIG. 6, taken along the direction 7-7. As depicted, the network switch 600 is similar to the network switch 202b, with the difference that a barrier 602 may be placed in the open notch. In embodiments, the barrier 602 may ensure proper air flow continues between the front and back of the rack. In embodiments, the barrier 602 may include flexible fingers, brush type material, compressed foam, or any other suitable material. Optionally, when the network switch 600 is not in use, a blank panel may also be placed in the notch to ensure proper cooling air flow between the front and back of the rack.

To illustrate the beneficial effects of the notches, only network switches are shown in FIGS. 3-7. However, it should be apparent to those of ordinary skill in the art that other suitable types of devices installed in the racks may have notches similar to the notches 270-274 and that each device may have one or more of the notches 270-274. The devices that implement at least one or more of the functions and/or operations described herein may comprise an application or applications operating on at least one computing system. The computing system may comprise one or more computers and one or more databases. The computer system may be a single system, a distributed system, a cloud-based computer system, or a combination thereof.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 8:
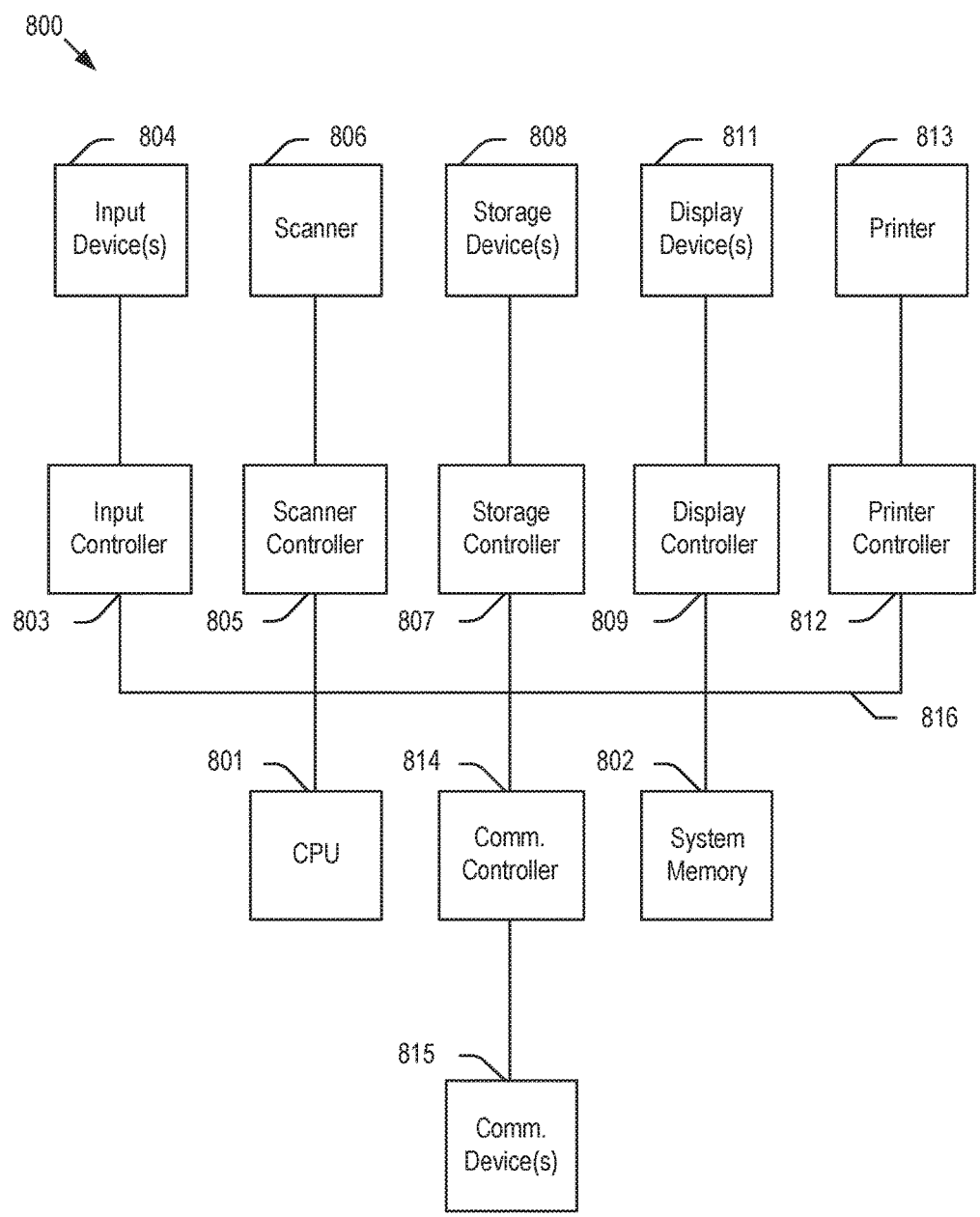
FIG. 8 shows a computer system according to embodiments of the present disclosure.

An exemplary information handling system 800, which may include one or more notches, will now be described with reference to FIG. 8, although differently configured information handling systems may also be employed. Each device/equipment in FIGS. 3-7 may include one or more components in the information handling system 800. As illustrated in FIG. 8, system 800 includes a central processing unit (CPU) 801 that provides computing resources and controls the computer. CPU 801 may be implemented with a microprocessor or the like, and may also include a graphics processor and/or a floating point coprocessor for mathematical computations. System 800 may also include a system memory 802, which may be in the form of random-access memory (RAM) and read-only memory (ROM).

A number of controllers and peripheral devices may also be provided, as shown in FIG. 8. An input controller 803 represents an interface to various input device(s) 804, such as a keyboard, mouse, or stylus. There may also be a scanner controller 805, which communicates with a scanner 806. System 800 may also include a storage controller 807 for interfacing with one or more storage devices 808 each of which includes a storage medium such as magnetic tape or disk, or an optical medium that might be used to record programs of instructions for operating systems, utilities and applications which may include embodiments of programs that implement various aspects of the present disclosure. Storage device(s) 808 may also be used to store processed data or data to be processed in accordance with the disclosure. System 800 may also include a display controller 809 for providing an interface to a display device 811, which may be a cathode ray tube (CRT), a thin film transistor (TFT) display, or other type of display. System 800 may also include a printer controller 812 for communicating with a printer 813. A communications controller 814 may interface with one or more communication devices 815, which enables system 800 to connect to remote devices through any of a variety of networks including the Internet, an Ethernet cloud, an FCoE/DCB cloud, a local area network (LAN), a wide area network (WAN), a storage area network (SAN) or through any suitable electromagnetic carrier signals including infrared signals.

In the illustrated system, all major system components may connect to a bus 816, which may represent more than one physical bus. However, various system components may or may not be in physical proximity to one another. For example, input data and/or output data may be remotely transmitted from one physical location to another. In addition, programs that implement various aspects of this disclosure may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

One skilled in the art will also recognize that a number of the elements described above may be physically and/or functionally separated into sub-modules or combined together.

It will be appreciated to those skilled in the art that the preceding examples and embodiment are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure.

What is claimed is:

1. A device for communicating data through one or more network cables, comprising: a housing surrounding one or more components of the device and having front, back, top and bottom sides; at least one port located on at least one of the front and back sides of the housing, configured to receive an end plug of a network cable and communicatively coupled to the one or more components; the housing including at least one opening formed on at least one of the front and back sides, the at least one opening being configured to allow the network cable to pass through the at least one opening when the housing is installed on a rack structure; at least one side of the housing defining a space so as to allow the network cable to travel between the front side to the back side through the at least one opening and the space; and a barrier at least partially disposed in the at least one opening and configured to at least partially restrict an air flow through the at least one opening, wherein the barrier is formed of at least one of flexible fingers, a brush-type material, and a compressible material.

2. A device as recited in claim 1, wherein the barrier is configured to receive a blank panel to control air flow.

3. A device as recited in claim 1, further comprising: a mechanism that generates air flow through the device, the air flow extracting heat energy from the device.

4. An information handling system housing, comprising: a plurality of surfaces that form an interior compartment for receiving and at least partially enclosing a set of components of an information handling system; a cable routing volumetric space for receiving one or more cables to facilitate routing the one or more cables from a first side of the housing to a second side of the housing, the interior compartment and the cable routing volumetric space having a combined dimensional space that is a standardized rack unit size when installed on a rack structure; a rack mounting portion that facilitates affixing the information handling system housing to a rack structure; at least one opening formed on at least one of the plurality of surfaces and configured to allow a cable to pass through the at least one opening; and a barrier at least partially disposed in the at least one opening and configured to at least partially restrict an air flow through the at least one opening, wherein the barrier is formed of at least one of flexible fingers, a brush-type material, and a compressible material.

5. An information handling system housing as recited in claim 4, wherein the first and second sides face opposite directions.

6. An information handling system housing as recited in claim 4, further comprising:
   at least one port located on at least one of the plurality of surfaces and configured to receive an end plug of a cable.

7. An information handling system housing as recited in claim 4, wherein the barrier is configured to receive a blank panel to control air flow.

8. A device for handing data through one or more network cables, comprising: at least one port located on at least one of the front and back sides of the device and configured to receive an end plug of a network cable; a housing at least partially enclosing one or more components of the device that are communicatively coupled to the at least one port and having at least one opening so as to allow the network cable to travel between the front side and the back side through the at least one opening when the housing is installed on a rack structure; and a barrier at least partially disposed in the at least one opening and configured to at least partially restrict an air flow through the at least one opening, wherein the barrier is formed of at least one of flexible fingers, a brush-type material, and a compressible material.

9. A device as recited in claim 8, wherein the housing has a surface that at least partially defines an interstitial volumetric space so as to allow the network cable to travel through the interstitial volumetric space.

10. A device as recited in claim 9, wherein the barrier is configured to receive a blank panel to control air flow.

* * * * *